US006699571B1

(12) United States Patent
Antalek

(10) Patent No.: US 6,699,571 B1
(45) Date of Patent: Mar. 2, 2004

(54) DEVICES AND METHODS FOR MOUNTING COMPONENTS OF ELECTRONIC CIRCUITRY

(75) Inventor: John Antalek, New Bedford, MA (US)

(73) Assignee: Morgan Advanced Ceramics, Inc., Belmont, CA (US)

( * ) Notice: Subject to any disclaimer, the term of this patent is extended or adjusted under 35 U.S.C. 154(b) by 0 days.

(21) Appl. No.: 10/107,564

(22) Filed: Mar. 27, 2002

(51) Int. Cl.$^7$ .......................... B32B 3/00; H01L 23/495
(52) U.S. Cl. ...................... 428/210; 428/209; 257/675; 257/703; 257/712; 257/720
(58) Field of Search ................. 428/210, 209; 257/675, 712, 720, 703

(56) References Cited

U.S. PATENT DOCUMENTS

| | | |
|---|---|---|
| 2,857,663 A | 10/1958 | Beggs |
| 3,787,958 A | 1/1974 | Freedman et al. |
| 3,897,223 A | 7/1975 | Purdy et al. |
| 3,911,553 A | 10/1975 | Burgess et al. |
| 3,993,411 A | 11/1976 | Babcock et al. |
| 3,994,430 A | 11/1976 | Cusano et al. |
| 4,053,728 A | 10/1977 | Talento et al. |
| 4,426,033 A | 1/1984 | Mizuhara |
| 4,471,026 A | 9/1984 | Nicholas et al. |
| 4,563,383 A | 1/1986 | Kuneman et al. |
| 4,598,025 A | 7/1986 | Mizuhara |
| 4,755,741 A | 7/1988 | Nelson |
| 4,811,893 A | 3/1989 | Kanahara et al. |
| 4,901,904 A | 2/1990 | Tsuno |
| 4,906,511 A | 3/1990 | Sato et al. |
| 4,996,116 A | 2/1991 | Webster et al. |
| 5,013,612 A | 5/1991 | Hunt et al. |
| 5,033,666 A * | 7/1991 | Keusseyan et al. ......... 228/122 |
| 5,076,863 A | 12/1991 | Taniguti et al. |
| 5,082,161 A | 1/1992 | Utida et al. |
| 5,138,426 A | 8/1992 | Umeda et al. |
| 5,356,661 A | 10/1994 | Doi et al. |
| 5,574,314 A * | 11/1996 | Okada et al. ................ 257/728 |
| 5,581,876 A * | 12/1996 | Prabhu et al. ................ 29/851 |
| 5,629,559 A * | 5/1997 | Miyahara .................... 257/666 |
| 5,637,406 A | 6/1997 | Asai et al. |
| 6,261,708 B1 | 7/2001 | Ohashi et al. |
| 6,271,585 B1 | 8/2001 | Osada et al. |
| 6,316,826 B1 * | 11/2001 | Yamamoto et al. ......... 257/705 |

* cited by examiner

Primary Examiner—Cathy Lam
(74) Attorney, Agent, or Firm—Bruce D. Gray; Dean W. Russell; Kilpatrick Stockton LLP

(57) ABSTRACT

Devices and methods for mounting components of electronic circuitry and these mounting devices are capable of surviving repeated thermal cycling. The devices comprise two metal laminate members brazed to a ceramic member on each of the two major surfaces of the ceramic member. The laminates preferably comprise a layer of molybdenum disposed between two layers of copper. The thickness of the individual layers comprising the metal laminate member may be varied to yield a laminate CTE similar to the CTE of the ceramic member to be joined.

12 Claims, 5 Drawing Sheets

DEVICES AND METHODS FOR MOUNTING COMPONENTS OF ELECTRONIC CIRCUITRY

BACKGROUND OF THE INVENTION

1. Field of Invention

The invention relates to a substrate for mounting components of electronic circuitry, such as integrated circuit electronic components and discrete electronic components. In particular, the invention relates to metal-ceramic substrates that are suitable for mounting components of electronic circuitry used in applications such as control and conversion of electric power.

2. Description of the Related Art

Substrates comprising a ceramic layer and a metal layer are commonly used as devices for mounting electronic components to provide electrical isolation and high current carrying capacity. Such mounting devices commonly have thermal conductivity properties that allow them to transfer heat generated by electronic components away from the electronic components to a heat sink. Mounting devices with appropriate thermal conductivity properties reduces the power consumption of electronic components, allowing electronic circuit designers to use electronic components with reduced footprints. This is particularly important in certain military and space applications, where space may be limited and lower weight electronic components are desired.

Examples of such substrates use a copper-copper oxide eutectic bond between copper and aluminum oxide. These substrates are commonly referred to as Direct Bond Copper (DBC) device because the bonding process does not require a filler metal. For example, U.S. Pat. No. 3,911,553 describes such a method of creating a DBC-type substrate.

However, DBC-aluminum oxide mounting devices do not have the thermal conductivity necessary to allow them to transfer heat away from the electronic components, which is important for high power and high temperature applications such as military, space or automotive applications. Therefore, DBC-aluminum nitride mounting devices have been preferred due to their superior thermal conductivity. For example, U.S. Pat. No. 4,996,116 describes an enhanced direct bond structure of copper and aluminum nitride for mounting electronic components.

Although DBC-aluminum nitride devices are more effective than DBC-aluminum oxide devices in transferring heat away from the electronic components, DBC-aluminum nitride devices still present several disadvantages.

For example, the eutectic bond between copper and aluminum nitride commonly fails during the thermal cycling that is required for certain applications, such as military and space applications. Military and space applications typically require electronic components that can survive approximately 1000 thermal cycles from −65° C. to 200° C. However, most DBC-type devices fail well below the required 1000 thermal cycles.

One of the reasons for this failure is the extreme difference in the co-efficient of thermal expansion (CTE) between the copper layer of DBC-type devices and the ceramic layer. For example, the copper layer of a DBC-type device has a CTE of approximately 18 ppm/° C., whereas the aluminum nitride layer has a CTE of approximately 5 ppm/° C. Because of this extreme difference in CTE, the copper layer has a tendency to harden during thermal cycling, resulting in the ceramic cracking.

The CTE of the copper layer of DBC-type mounting devices is also extremely different from that of materials commonly used to make electronic components, such as silicon, silicon carbide and gallium arsenate. For example, silicon has a CTE of approximately 2.8 ppm/° C., which is much lower than the CTE of the copper layer of DBC-type mounting -devices, which is approximately 18 ppm/° C. Due to this extreme difference in CTE, the copper layer of the DBC-type device tends to contract more than the electronic components mounted to it, warping the electronic components out of their original shapes, which in turn affects the performance of the electronic components.

Another disadvantage of the DBC-type devices is their inability to be reheated to temperatures above approximately 650° C. in a reducing atmosphere without separating the copper-ceramic bond. Reheating is sometimes necessary to mount additional electronic components onto the mounting device or to join the mounting device carrying the electronic components to a base plate or a heat sink. For example, the process of brazing the DBC-type substrate to a base plate may require the mounting device to be reheated up to 700° C. in a reducing atmosphere, a temperature that delaminates a DBC-ceramic bond.

Another problem with the DBC-type devices occurs when creating a eutectic bond between copper and a ceramic. Successful creation of such a eutectic bond is dependent on accurately maintaining furnace parameters such as furnace temperature, furnace atmosphere and time at desired temperature during the bonding process. Even slight changes in these furnace parameters can cause an incomplete eutectic melt formation, resulting in an inadequate bond.

Furthermore, the process of direct bonding copper to ceramic creates a thin layer of oxidation on the copper surface for mounting electronic components, which is not desirable, especially if the mounting surface has to be rebrazed to mount additional electronic components. This requires the layer of oxidation to be removed before the rebrazing process, adding an additional level of unnecessary complexity.

Accordingly, there is a need in the art for a substrate-type device for mounting electronic components, which provides superior thermal conductivity and is also capable of surviving thermal cycles required for high power or high temperature applications, such as military, space or automobile applications. There is also a need for a mounting device that can be reheated to brazing temperatures without weakening the metal to ceramic bond.

SUMMARY OF THE INVENTION

The present invention relates to devices for mounting electronic components to form part of electronic circuitry. The devices preferably comprise two metal members coupled to one ceramic member with the resulting assembly having two major surfaces comprising the metal members and the ceramic member disposed in-between. One of the metal members will then be used to mount electronic components. The other metal member will be joined to either a base plate or directly to a heat sink forming part of a hybrid electronic circuit.

In one embodiment of the invention, the second metal member is mounted onto a base plate. In this embodiment, the metal members are preferably formed using a copper-molybdenum-copper (CMC) laminate comprising one layer of molybdenum disposed between two layers of copper, with one surface of each of the CMC laminates being joined to opposite major surfaces of the ceramic. In this embodiment, the ceramic comprises aluminum nitride, which has suitable thermal conductivity for high temperature applications. However, other ceramics such as aluminum oxide, silicon nitride, or beryllium oxide are acceptable alternatives.

According to various embodiments of this invention, the CTE of the CMC laminates is similar to the CTE of the ceramic being joined between each CMC laminate. This will allow the joint between the CMC laminate and the ceramic member to survive successive thermal cycling. Therefore, the CTE of a CMC is preferably varied to match the CTE of the ceramic member.

The CTE of the CMC laminate is varied by changing the thickness of each of the two copper layers and the molybdenum layer relative to the entire thickness of the CMC laminate. For example, for an aluminum nitride device, the thickness of the various layers comprising the CMC laminate will be selected to achieve a CMC laminate CTE similar to the CTE of aluminum nitride. However, if the ceramic chosen is aluminum oxide, then the thickness of the various component layers of the CMC laminate will be adjusted to achieve a laminate CTE similar to the CTE of aluminum oxide. It is also possible to manufacture the metal members of the mounting device from metal composites such as copper-molybdenum composite, copper-tungsten composite, or laminates of metals other than copper and molybdenum.

In another embodiment of the invention, the second metal member itself serves as the base plate, which is mounted to a heat sink to form part of a hybrid electronic circuit. In this embodiment, the metal members are preferably formed as described above. In some instances, this structure provides an advantage over the first described embodiment because it reduces the number of interfaces through which the heat generated by the electronic components has to travel in order to reach the heat sink. In a high power or high temperature application, this can improve the performance of the electronic components. However, it may be necessary that the base plate comprise metal substrates other than a CMC laminate due to manufacturing specifications provided by a circuit designer for reasons peculiar to the specific application. For example, eight restrictions might influence the choice of the base plate material.

The present invention also relates to a method of making devices for mounting electronic components. More specifically, the two CMC laminates for forming the two metal members of the present mounting device are prepared by joining a layer of molybdenum with two layers of copper on each of its two major surfaces. Both the CMC laminates are then coated on one surface with an active metal, such as titanium, preferably (although not necessarily) using a sputtering process or other suitable physical vapor deposition processes. The surfaces of the CMC laminates coated with an active metal, such as titanium, are then brazed onto a ceramic member, such as aluminum nitride.

The brazing is accomplished by heating the assembly of the two CMC laminates coated with an active metal, such as titanium and the ceramic member, above a point sufficient to create an initial melt formation between the active metal and the copper layer of the CMC laminate, but below the melting point of the copper. Once this assembly is cooled, the alloy resulting from the melt formation between the active metal and the copper layer of the CMC laminate forms a firm bond between the CMC laminate and the ceramic member. In one embodiment, one surface of the assembly is mounted onto a separate base plate. In an alternate embodiment, the bottom CMC laminate can itself serve as the base plate. The top CMC laminate surface of the joined assembly can be used to mount the electronic components.

One of the advantages provided by this invention is that the CTE of the CMC laminate can be easily varied to match the CTE of the ceramic member. Such a match in the CTE will provide an assembly that can survive thermal cycling. Another advantage of this invention is that it allows the heat sink to draw heat away from electronic components more effectively, which reduces the failure of such components due to overheating. Furthermore, the mounting device of this invention can be more easily manufactured than DBC-type mounting devices. Another advantage of the metal-ceramic mounting device according to various embodiments of this invention is that it can be reheated to brazing temperatures without weakening the bond between the ceramic and the metal.

DETAILED DESCRIPTION

This invention will now be described more fully with reference to the drawings, showing preferred embodiments of the invention. However, this invention can be embodied in many different forms and should not be construed as limited to the embodiments set forth.

Figure 1:
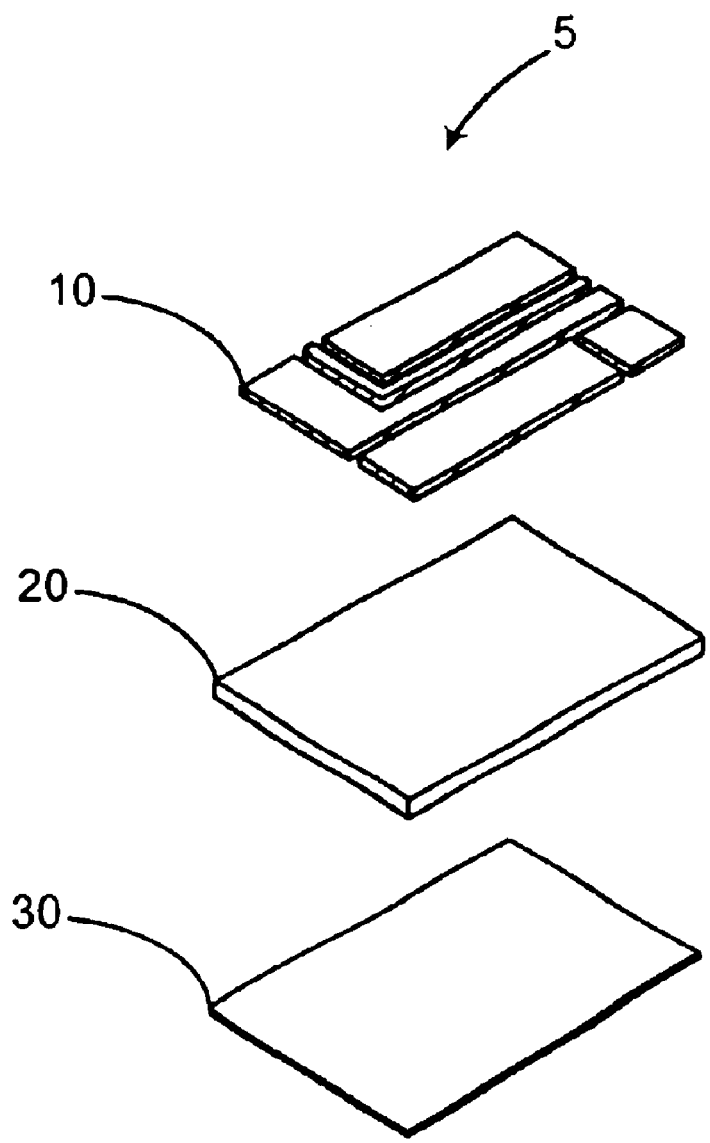
FIG. 1 is an exploded perspective view of a device according to one embodiment of the present invention in which the bottom component is adapted to be mounted to a base plate.
Figure 1A:
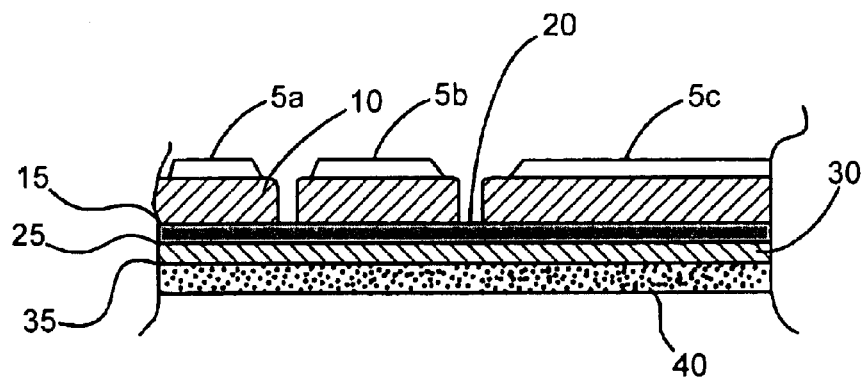
FIG. 1a is a cross-sectional view of the assembled mounting device of FIG. 1 having electronic components mounted thereon.
Figure 1B:
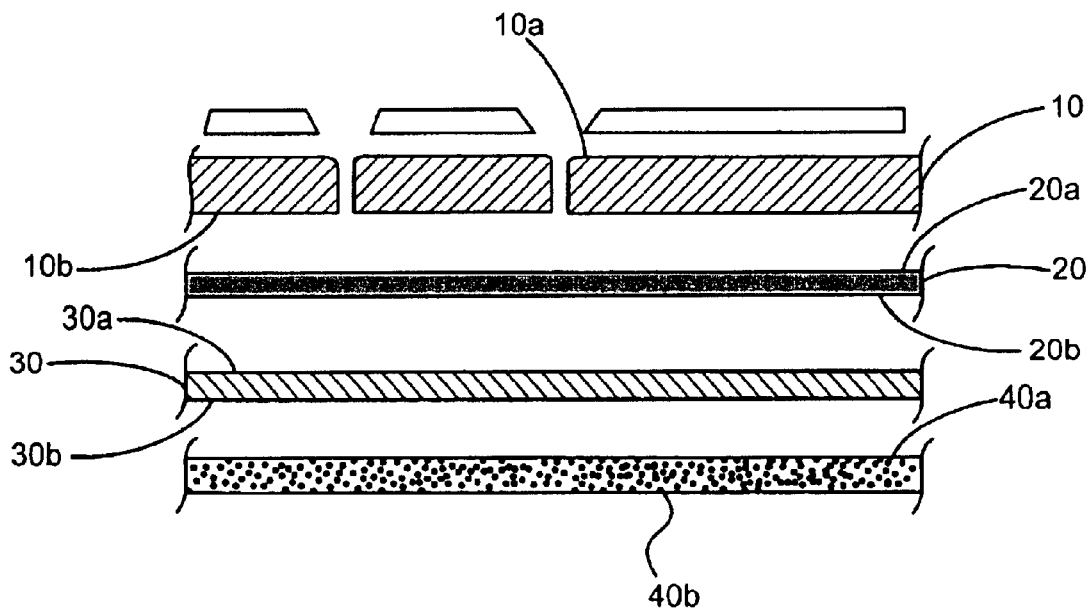
FIG. 1b is an exploded cross-sectional view of the mounting device of FIG. 1.

An exemplary embodiment of a device for mounting electronic components is shown in FIGS. 1, 1a and 1b. Generally, the mounting device 5 comprises three main members 10, 20, and 30. Ceramic member 20 is disposed between two metal members 10 and 30. The metal members 10, and 30 are joined to opposite major surfaces of the ceramic member 20 to form the improved mounting device of the present invention.

As shown in FIGS. 1a and 1b, metal members 10 and 30 each have two primary opposed surfaces 10a–b and 30a–b respectively. Metal member 10 is the surface layer to which the electronic components 5a–c are mounted. The specific shape of metal member 10 may be dictated by the shape and size of the electronic components 5a–c, which is necessary to provide electrical isolation for each individual electronic component.

Metal member 30 is mounted to a base plate 40. The electronic components 5a–c may be electrically connected to each other to form a hybrid circuit. Such hybrid circuits are part of larger electronic circuitry intended to control and operate equipment, such as those used in military, space and automobile applications.

I. A Ceramic Member According to One Embodiment of the Invention.

As shown FIGS. 1, 1a and 1b, ceramic member 20 may comprise materials such as aluminum nitride, silicon oxide, beryllium oxide or aluminum oxide. However, aluminum nitride is preferred because it is non-toxic and has superior thermal conductivity, which transfers the heat generated by the electronic components, resulting in improved performance of the electronic components. As shown in FIG. 1b, the ceramic member 20 has two major opposed surfaces 20a and 20b. Surface 20a is joined to surface 10b of the metal member 10 to form the joint 15 shown in FIG. 1a. Surface 20b is joined to surface 30a of the metal member 30 to form the joint 25 shown in FIG. 1a.

II. A CMC Laminate According to One Embodiment of the Invention.

Figure 1C:
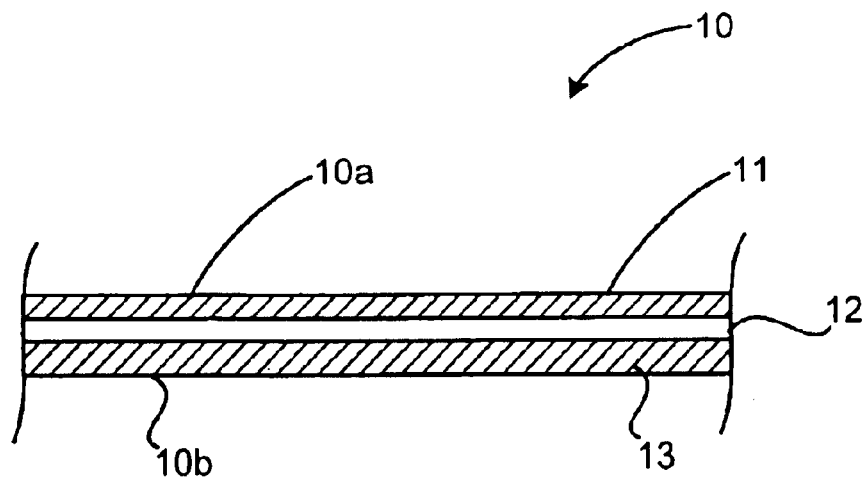
FIG. 1c is a cross-sectional view of one embodiment of a CMC laminate according to one embodiment of the present invention.
Figure 1D:
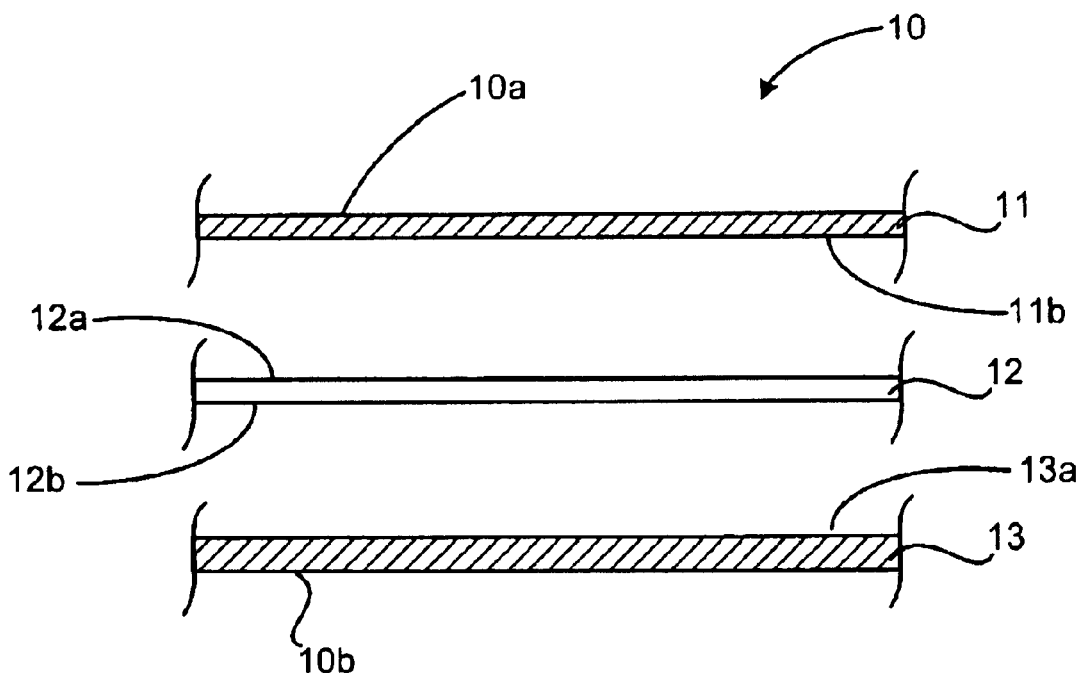
FIG. 1d is an exploded cross-sectional view of the CMC laminate of FIG. 1c.

Metal members 10 and 30 of FIGS. 1, 1a and 1b preferably comprise a CMC laminate. The CMC laminate as shown in FIGS. 1c and 1d is made of one layer 12 of molybdenum disposed between two layers 11 and 13 of copper. CMC laminates are commercially available through vendors such as Climax Specialty Metals and Clad Metal Specialties. The CMC laminates are available at various thickness specifications and shapes to meet any specific need.

CMC laminates are preferred because the CTE of a CMC laminate can be easily adjusted to closely match the CTE of any desired ceramic. Matching the CTE of the metal members 10 and 30 to the CTE of the ceramic member 20 is necessary for the mounting device to successfully survive thermal cycling.

During thermal cycling, the mounting devices are subjected to temperatures ranging from −65° C. to 200° C. If there is a vast difference between the CTE of the metal members, 10 and 30, and the ceramic member 20, during such thermal cycling, the metal members contract and expand at a vastly different rate than the ceramic member, resulting in the metal to ceramic joints 15 and 25 shown in FIG. 1a being weakened. DBC-type mounting devices frequently fail thermal cycling due to such a vast difference between the CTE of their metal members and their ceramic member. However, in the mounting device of the present invention, metal-ceramic joint failures can be easily addressed by adjusting the CTE of metal members, comprising CMC laminates, to match the CTE of the ceramic member.

III. An Exemplary Method of Adjusting the CTE of the Metal Members.

Referring now to FIGS. 1c and 1d, a method of adjusting the CTE of a CMC laminate 10 will be described in more detail. FIG. 1c shows a cross-sectional view of one embodiment of a CMC laminate according to the present invention with all the layers joined. FIG. 1d shows an exploded cross-sectional view the CMC laminate of FIG. 1c. The entire thickness of the CMC laminate 10 will be dictated by the nature of, the devices to be mounted on to it and size constraints peculiar to a specific application. Given such a fixed thickness for the entire CMC laminate 10, the individual thickness of the component layers of copper 11 and 13 and molybdenum 12 may be varied as a percentage of the thickness of the entire laminate, to choose a CMC laminate CTE similar to the CTE of a desired ceramic. Such variations in the component layers change the mass of copper relative to the mass of molybdenum comprising a CMC laminate, resulting in changes to all physical properties of the laminate, including the laminate's CTE.

For example, if the ceramic member 20 of FIG. 1 comprises aluminum nitride, the entire thickness of the CMC laminate 10 of FIGS. 1c and 1d can be distributed between its three component layers 11, 12 and 13 to attain a CMC laminate CTE similar to the CTE of aluminum nitride, which is approximately 5 ppm/° C. A thickness distribution for the component layers of a CMC laminate found to be particularly effective for this purpose is, for example, 20% for first layer of copper, 60% for the layer of molybdenum and 20% for the second layer of copper. Therefore, in an exemplary mounting device of this invention, if the thickness of the CMC laminate 10, as shown in FIGS. 1c and 1d, is required to be 10 mils (mils is a unit of thickness equal to ¹⁄₁₀₀₀ of an inch), the first and second copper layers 11 and 13 of the CMC laminate 10 would each be 2 mils in thickness and the layer of molybdenum 12 would be 6 mils in thickness. The thickness distribution of component layers of the CMC laminate of exemplary device described above may also be expressed in terms of a ratio of the component layers to each other. Therefore, the aluminum nitride device described above may also be described as comprising CMC laminates having a C:M:C ratio of 20:60:20. CMC laminates with C:M:C ratios within a range such as 5:90:5 to 33:33:33 will also yield acceptable thermal cycling results.

However, the inventor has determined that the C:M:C ratio of 20:60:20 does not always yield a laminate CTE similar to the CTE of aluminum nitride, which is approximately 5 ppm/° C. Therefore, at times, it may be necessary to change the C:M:C ratio to accommodate other device requirements, such as a desired thickness for the entire CMC laminate, while still maintaining a CTE that is functionally close enough to the CTE of aluminum nitride.

For example, if the device specifications dictate that the thickness of the entire CMC laminate be greater than 20 mils, the inventor has found a C:M:C ratio of 13:74:13 to be particularly effective for attaining a CMC laminate CTE similar to the CTE of aluminum nitride. Such a CMC laminate greater than 20 mils in thickness and having a C:M:C ratio of 13:74:13 has been found to yield a laminate CTE of approximately 5.5 ppm/° C., which is sufficiently similar to the CTE of aluminum nitride for the purposes of this invention. Therefore, if an aluminum nitride device of the present invention is required to have CMC laminate layer 10 to be 20 mils in thickness, it is preferable for the two copper layers 11 and 13 to have a thickness of 2.6 mils each and for the molybdenum layer 12 to be approximately 14.8 mils thick.

Another reason for changing the C:M:C ratio may be to attain a CTE similar to that of a ceramic other than aluminum nitride. For example, if the ceramic member 20 is aluminum oxide rather than aluminum nitride, it is necessary to change the ratio of C:M:C to attain a CMC laminate CTE similar to the CTE of aluminum oxide. A C:M:C ratio of 33:34:33 has been found to be particularly effective in achieving a CMC laminate CTE similar to the CTE of aluminum oxide. Therefore, with aluminum oxide forming the ceramic member of FIG. 1, CMC laminates 10 and 30 would preferably comprise two layers of copper and a layer of molybdenum all approximately of equal thickness. However, CMC laminates with C:M:C ratios within a range such as 5–33:33–90:5–33 will also yield acceptable thermal cycling results.

IV. Joining of Component Layers to Form Laminate.

Once the thickness of the component layers of a CMC laminate is selected to achieve a desired CTE, the component layers may be joined together to form the laminate. As shown in FIGS. 1c and 1d, the layer of molybdenum has two major opposed surfaces 12a and 12b. Likewise, the first and second layer of copper 11 and 13 each have two major opposed surfaces 10a and 11b, and 13a and 10b respectively. The laminates are formed by joining top surface 12a of molybdenum layer 12 to surface 11b of the first layer of copper 11 and the bottom surface 12b of the molybdenum layer to the top surface 13a of the second layer of copper 13. Any known method of joining two metal surfaces may be used to create the joints between the copper layers and the layer of molybdenum. By way of non-limiting example, the copper layers the molybdenum layer may be direct bonded, hot rolled, brazed, soldered or explosion welded together.

V. Joining Laminate to the Ceramic Member.

Any of the several known methods for joining a ceramic member to a metal member can be employed to create the joint between the ceramic member 20 and metal members 10 and 30. For example, U.S. Pat. No. 4,471,026, incorporated herein by reference, teaches a method of soldering with an alloy of titanium, copper and a metal selected from silver, gold, tin or indium. Another example is found in U.S. Pat. No. 4,901,904, incorporated herein by reference, which teaches a method of brazing a metal member to a ceramic member using a pre-formed metal substrate made of at least two different metals as the filler metal.

In one embodiment of the present invention, the ceramic member 20 is joined to the top and bottom CMC laminate members 10 and 30 respectively by a method of brazing using a titanium-copper alloy as the filler metal. The top and bottom CMC laminate members 10 and 30 are first prepared by purifying the entire CMC laminate member. Next, as shown in FIG. 1b, the metal surfaces 10b and 30a are adapted to be joined to the ceramic surfaces 20a and 20b by roughening the metal surfaces with a vapor-honing machine. Other methods of roughening the metal surfaces such as but not limited to machining, grinding, lapping or chemical etching may also be acceptable.

Next, titanium is applied to the metal surfaces 10b and 30a by the process of sputtering the titanium onto the metal surfaces. Although physical vapor deposition by sputtering is the preferred method, titanium can be applied to the metal surfaces 10b and 30a by employing chemical vapor deposition, vacuum deposition, ion implantation, metal plating and various other processes. For example, suitable alternatives to sputtering include but are not limited to placing a thin metal foil of titanium between the surfaces to be brazed.

Once the titanium is applied, the metal surface 10b is joined with ceramic surface 20a and metal surface 30a is joined with ceramic surface 20b. This assembly is physically held in place by a suitable fixing means such as a vice, or a nut and bolt assembly.

In one embodiment, the assembly is then placed in a furnace capable of maintaining a partial pressure of oxygen lower than $10^{-5}$ torr, such as a vacuum furnace or an inert gas furnace. The assembly is then heated to a temperature above a point sufficient to create an initial melt formation between the titanium and the copper layer of the CMC laminate, but below the melting point of the copper comprising the CMC laminate metal members 10 and 30. At such a temperature, titanium layers applied to metal surfaces 10b and 30a react with the copper to form a molten alloy of titanium and copper, which forms a strong bond between the CMC laminate metal members 10 and 30 and the ceramic member 20 once the assembly is cooled below a suitable temperature. This process of brazing may be accomplished by using metals other than titanium. For example, active metals, such as zirconium, niobium, vanadium, and their alloys are particularly effective. However, factors such as cost and availability make titanium a more practical choice.

VI. Mounting to Base Plate.

Referring now to FIGS. 1, 1a and 1b, once the metal members 10 and 30 are brazed to the ceramic member 20, this metal-ceramic assembly having a bottom surface 30b will be mounted on the base plate 40 at surface 40a to form joint 35 with the resulting assembly to be further mounted to a heat sink at the bottom surface 40b and then onto a hybrid device package that forms part of electronic circuitry used in high power and high temperature applications, such as automobile, space and military applications. Mounting the metal-ceramic assembly to the base plate can be accomplished by any known methods of joining, such as soldering, brazing, applying adhesives and mechanical fastening. Furthermore the electronic components 5a–c may be mounted to the top surface 10a by any known method of joining, such as soldering, applying adhesives, affixing with a screw or nut and bolt assembly or other suitable joining methods.

VII. Alternate Embodiment having Laminate as Base Plate.

Figure 2:
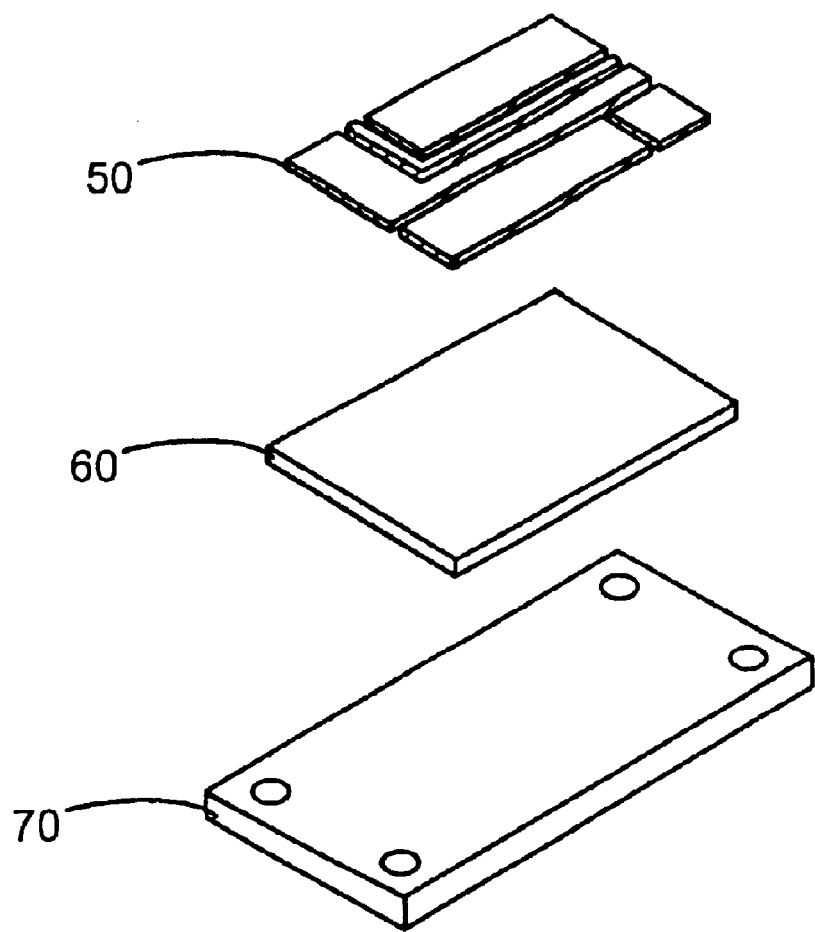
FIG. 2 is an exploded perspective view of a mounting device according to another embodiment of the present invention in which the bottom CMC laminate is adapted to serve as the base plate.
Figure 2A:
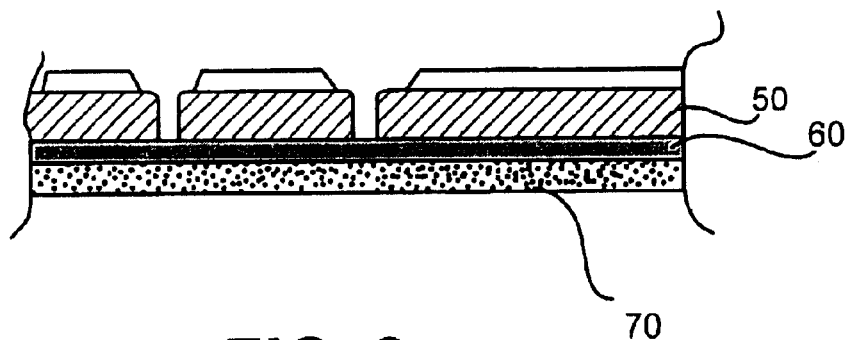
FIG. 2a is a cross-sectional view of an assembled version of the mounting device of FIG. 2 having electronic components mounted thereon.
Figure 2B:
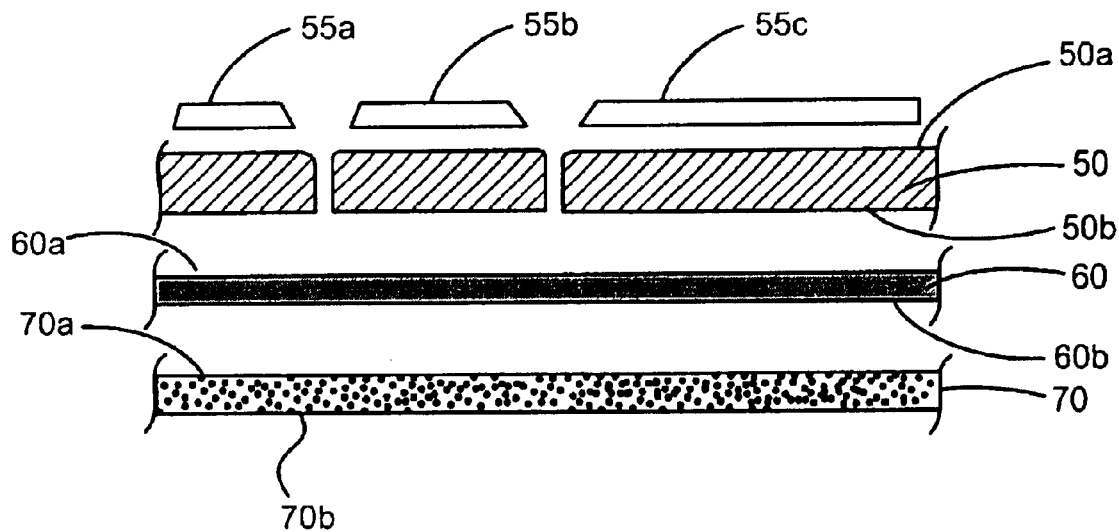
FIG. 2b is an exploded perspective view of the mounting device of FIG. 2.

In contrast to the embodiment described above, an alternate embodiment of the present invention is shown in FIGS. 2, 2a and 2b, wherein the bottom metal member 70 also serves as a base plate. The difference between this embodiment and that described above is the absence of an additional metal member between the base plate 70 and the ceramic member 60. FIGS. 2a and 2b show a cross-sectional of this embodiment.

Metal member 50 and base plate 70 are brazed to the ceramic member 60 as described above or according to any of the embodiments described. The base plate member 70 comprises a CMC laminate made according to the process described above in relation to the first embodiment. The first metal member 50 may also preferably comprise such a CMC laminate. The ceramic member 60 preferably comprise aluminum nitride or other suitable ceramic material described above.

As shown in FIG. 2b, surface 50b of metal member 50 is brazed to surface 60a of the ceramic member 60 using the brazing process described. Likewise, surface 70a of the base plate 70 is brazed to the surface 60b of the ceramic member 60. The resulting metal-ceramic-metal assembly may be directly mounted to a heat sink at surface 70b, which is then mounted to a hybrid circuit package. As shown in FIG. 2b, the electronic components 55a–c are mounted on surface 50a of the metal-ceramic-metal assembly.

As shown in FIG. 2, once the entire thickness of the CMC laminates comprising the base plate 70 and metal member 50 is determined according to the specific application, the C:M:C ratio of the CMC laminates is determined according to the process described above to match the CMC laminate CTE to the CTE of the ceramic member 60.

The elimination of the extra layer of metal in this embodiment provides several advantages. First, it is more cost effective and efficient because it eliminates a step in manufacturing the mounting device. Additionally, it reduces the number of layers or interfaces between the heat sink and the electronic components, enabling heat to be dissipated more effectively from the electronic components to the heat sink. This improves performance of the electronic components in high temperature applications, and also increases the life span of the electronic components. This provides a specific advantage to circuit designers working under cost constraints.

VIII. Further Embodiments of the Present Invention.

In the embodiments described above, metal members, 10 and 30 as shown in FIGS. 1, and 50 and 70 as shown in FIG. 2, are described as comprising a CMC laminate. Although CMC laminates are preferred, the metal members 10, 30, 50 and 70 may comprise several different materials having properties similar to those of the CMC laminate. For example, the metal members may comprise laminates made from one layer of nickel-iron alloy (with nickel comprising approximately 30–55 percent of the alloy by weight) disposed between two layers of copper, one layer of molybdenum disposed between two layers of nickel, or one layer of tungsten disposed between two layers of copper. However, these substitutes may be less desirable for some applications because the component metals are more expensive and not readily available commercially.

Furthermore, the preferred embodiments have been described as comprising metal laminates having one metal disposed between two layers of another type of metal. However, those skilled the art can understand that similar results may be achieved using metal laminates comprising any number of layers and any desired combination of metals described above. For example, a metal laminate may comprise only two layers comprising two different metals, such as copper and molybdenum, or nickel and molybdenum.

Additionally, the preferred embodiments have been described with metal elements 10, 30, 50, and 70 comprising metal laminates. However, those skilled in the art can appreciate that similar results can be achieved using composites of metals to create a metal member that has a CTE similar to the CTE a specific ceramic. For example, composites of metals such as copper, molybdenum, tungsten, nickel, nickel-iron alloy and the alloys thereof may be used in accordance with the present invention. However, these examples provided are for guidance only and it is understood that additional metals may be used in accordance with this invention.

The particular embodiments of the invention described above are merely illustrative and are not the only embodiments possible. Those skilled in the art can readily identify additional embodiments and features of the invention that are within the scope of the appended claims.

What is claimed is:

1. A device for mounting components of electronic circuitry that provides superior thermal conductivity and can survive thermal cycles required for high power or high temperature applications, the device comprising:
   a ceramic member having first and second major opposed surfaces;
   a first metal laminate member; and
   a second metal laminate member, the first and second metal laminate members respectively coupled to the first and second major surfaces of the ceramic member by brazing with a filler material; and
   wherein each of the first and second metal laminate members comprises a CMC laminate comprising a layer of molybdenum disposed between a first and second layer of copper, the laminates being formed prior to being coupled to the first and second surfaces of the ceramic member and the laminates having a coefficient of thermal expansion approximately equal to coefficient of thermal expansion of the ceramic member.

2. The device of claim 1, wherein the second metal laminate member is adapted to function as a base plate.

3. The device of claim 1, wherein the filler metal is an alloy of copper and a metal selected from the group consisting of titanium, zirconium, niobium, vanadium and alloys thereof.

4. The device of claim 1, wherein the:
   thickness of the first layer of copper comprises approximately 20 percent of entire thickness of at least one CMC laminate;
   thickness of the layer of molybdenum comprises approximately 60 percent of entire thickness of at least one CMC laminate; and
   thickness of the second layer of copper comprises approximately 20 percent of entire thickness of at least one CMC laminate.

5. The device of claim 1, wherein the:
   thickness of the first layer of copper comprises approximately 5–33 percent of the entire thickness of at least one CMC laminate;
   thickness of the layer of molybdenum comprises approximately 33–90 percent of the entire thickness of at least one CMC laminate; and
   thickness of the second layer of copper comprises approximately 5–33 percent of the entire thickness of at least one CMC laminate.

6. The device of claim 1, wherein the:
   thickness of the CMC laminate exceeds 20 mils;
   thickness of the first layer of copper comprises approximately 13 percent of the entire thickness of at least one CMC laminate;
   thickness of the layer of molybdenum comprises approximately 74 percent of the entire thickness of at least one CMC laminate; and
   thickness of the second layer of copper comprises approximately 13 percent of the entire thickness of at least one CMC laminate.

7. The device of claim 1, wherein the:
   thickness of the first layer of copper comprises approximately 33 percent of the entire thickness of at least one CMC laminate;
   thickness of the layer of molybdenum comprises approximately 33 percent of the entire thickness of at least one CMC laminate; and
   thickness of the second, layer of copper comprises approximately 33 percent of the entire thickness of at least one CMC laminate.

8. A method for making the device of claim 1 comprising,
   providing a ceramic member having first and second major opposed surfaces;
   providing a first metal laminate member comprising copper, molybdenum, and copper;
   providing a second metal laminate member comprising copper, molybdenum, and copper;
   coupling the first and second metal laminate members respectively to the first and second major surfaces of the ceramic member by brazing with a filler material.

9. The method of claim 8, wherein the metal laminate members are formed by joining a layer of molybdenum disposed between two layers of copper.

10. The method of claim 9, wherein the copper/molybdenum/copper metal laminate members are joined by a process selected from the group consisting of rolling, brazing, explosion welding, soldering and combinations thereof.

11. The method of claim 8, wherein the filler metal is an alloy of copper and titanium.

12. The method of claim 8, wherein the filler metal is an alloy of copper and a metal selected from the group consisting of, zirconium, niobium, vanadium and alloys thereof.

* * * * *